United States Patent
Roy (10) Patent No.: US 9,431,106 B1
(45) Date of Patent: Aug. 30, 2016

(54) TERNARY CONTENT ADDRESSABLE MEMORY (TCAM) WITH MAGNETIC TUNNEL JUNCTION (MTJ) DEVICES

(71) Applicant: FREESCALE SEMICONDUCTOR, INC., Austin, TX (US)

(72) Inventor: Anirban Roy, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/734,742

(22) Filed: Jun. 9, 2015

(51) Int. Cl.
| | |
|---|---|
| G11C 15/00 | (2006.01) |
| G11C 15/04 | (2006.01) |
| G11C 8/00 | (2006.01) |
| G11C 5/02 | (2006.01) |
| G11C 13/00 | (2006.01) |
| G11C 11/56 | (2006.01) |
| G11C 5/06 | (2006.01) |

(52) U.S. Cl.
CPC ............... *G11C 15/046* (2013.01); *G11C 5/02* (2013.01); *G11C 5/06* (2013.01); *G11C 11/5678* (2013.01); *G11C 13/0004* (2013.01); *G11C 15/00* (2013.01)

(58) Field of Classification Search
CPC . G11C 15/00; G11C 15/046; G11C 13/0004; G11C 11/5678; G11C 5/02; G11C 5/06
USPC .............................................. 365/49.1, 49.17
See application file for complete search history.

(56) References Cited

U.S. PATENT DOCUMENTS

| 7,782,646 B2 | 8/2010 | Lam et al. |
| 8,659,926 B1 | 2/2014 | Derhacobian |
| 2011/0051482 A1* | 3/2011 | Chang ................ G11C 7/1006 365/49.1 |
| 2011/0051483 A1* | 3/2011 | Chang ................ G11C 7/1006 365/49.1 |
| 2011/0051485 A1* | 3/2011 | Chang ................ G11C 15/00 365/49.17 |
| 2011/0051486 A1* | 3/2011 | Chang ................ G11C 15/046 365/49.17 |

OTHER PUBLICATIONS

Matsunaga et al, "Implementation of a perpendicular MTJ-based read-disturb-tolerant 2T-2R nonvolatile TCAM based on a reversed current reading scheme", 17th Asia and South Pacific Design Automation Conference (ASP-DAC), Jan. 30-Feb. 2, 2012, pp. 475-476, Sydmey, NSW.
Pagiamtzis et al, "Content-addressable memory (CAM) circuits and architectures: a tutorial and survey", IEEE Journal of Solid-State Circuits, Mar. 2006, pp. 712-727, vol. 41, Issue 3.
Renesas, "20Mbit QUAD-Search Content Addressable Memory", 2 pages, 2010.
Guo et al, "A Resistive TCAM Accelerator for Data-Intensive Computing", MICRO, Dec. 3-7, 2011, 12 pages.
Eshraghian et al, "Memristor MOS Content Addressable Memory (MCAM): Hybrid Architecture for Future High Performance Search Engines", IEEE Transactions on Very Large Scale Integration (VLSI) Systems, May 24, 2010, pp. 1407-1417, vol. 19, Issue 8.

* cited by examiner

*Primary Examiner* — Ly D Pham (57) ABSTRACT

A ternary content addressable memory (TCAM) cell is coupled to a first word line and a first match line and includes a first data storage portion coupled to a first search line, a second data storage portion coupled to a complement of the first search line, and a resistor divider portion including two resistive elements coupled in series with the first and second data storage portions of the first TCAM cell. The first and second data storage portions of the first TCAM cell are coupled to a first supply voltage and include two resistive elements coupled in parallel.

13 Claims, 4 Drawing Sheets

TERNARY CONTENT ADDRESSABLE MEMORY (TCAM) WITH MAGNETIC TUNNEL JUNCTION (MTJ) DEVICES

BACKGROUND

1. Field

This disclosure relates generally to memories, and more specifically, to a ternary content addressable memory (TCAM) with magnetic tunnel junction (MTJ) devices.

2. Related Art

A content addressable memory (CAM) is a type of memory which is typically used in high-speed search operations. For a search operation, a CAM compares input search data against a table including rows of stored data, and returns the address of the matching data. Two basic types of CAMs are a binary CAM (BCAM) and a ternary CAM (TCAM). In a BCAM, each bitcell stores one of two states, a logic "1" or a logic "0", such that the input search data is compared with each row of the table to determine whether the stored data of the row matches the input search data. In a TCAM, each bitcell stores one of three states, a logic "1", a logic "0", or a "don't care" value, in which the "don't care" value results in a match of the bit regardless of the value of the input bit of the search data. Therefore, in a TCAM, each bitcell includes a first bitcell portion configured to store a first bit and a second bitcell portion configured to store a second bit, in which the state of the bitcell is encoded with the two bits.

Different types of circuitries may be used to store the first bit and second bit within a TCAM bitcell. For example, a pair of latches formed using complementary MOS devices can be used to store two bits per bitcell. Alternatively, in order to achieve greater density and reduced power, magnetic tunnel junction devices may be used. However, with MTJ devices, read disturb, in which a bit within the TCAM bitcell changes states unintentionally, becomes an increasingly larger problem. Therefore, a need exists for a TCAM formed with MTJ devices with improved read disturb immunity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In a ternary CAM, two MTJ devices are implemented with two sets of parallel coupled bi-directional resistive elements to improve read disturb immunity. In one embodiment, the parallel coupled resistive elements form a resistor divider with a set of series coupled bi-directional resistive elements, in which the set of series coupled resistive elements is shared between the two sets of parallel coupled resistive elements. Furthermore, through the use of both internal and external reference bitcells in the ternary CAM array, improved reference match lines are provided which allow for improved detection between the case in which all bits of a row match or a weak mismatch, in which just one bit in the row mismatches. In this manner, an improved ternary CAM may be achieved.

Figure 1:
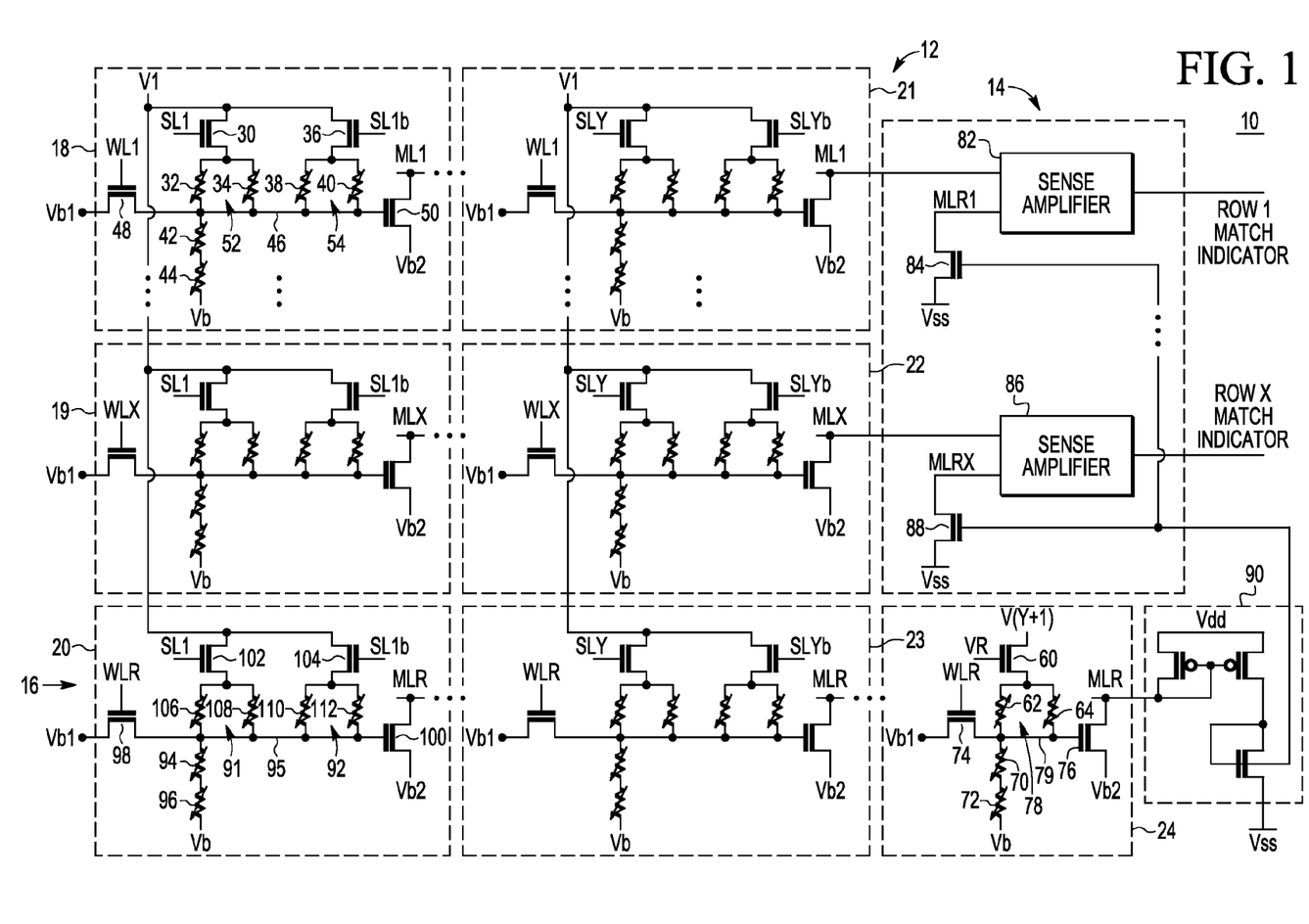
FIG. 1 illustrates, in partial schematic and partial block diagram form, a ternary content addressable memory (TCAM) in accordance with one embodiment of the present invention.

FIG. 1 illustrates a TCAM 10 in accordance with one embodiment of the present invention. TCAM 10 includes a memory array 12 which includes an array of X+1 rows and Y columns of TCAM bitcells. Note that each of X and Y can be any integer value greater than or equal to 1. Array 12 includes bitcells 18-23. Bitcells 20 and 23 of array 12 are characterized as reference bitcells which are within array 12 and may therefore be referred to as internal reference bitcells 20 and 23. TCAM 10 also includes an external reference bitcell 24 coupled to row (X+1). Row (X+1) forms a reference row 16 which includes an additional column (Y+1). Therefore, reference row 16 includes Y+1 bitcells: internal reference bitcells, such as those bitcells in row (X+1) which are within array 12, and an external reference bitcell, such as bitcell 24 which is external to array 12. Each bitcell in array 12 is coupled to a corresponding word line WL1-WLX and WLR, a corresponding match line, ML1-MLX and MLR, and a corresponding pair of true and complementary search lines, SL1/SL1b-SLY/SLYb. Each bitcell within a column is coupled to receive a corresponding supply voltage, V1-VY. Also, each bitcell is coupled to receive supply voltages Vb and Vb2.

As will be described in more detail below, each bitcell in array 12 includes two MJT devices and is configured to store two bits, in which the two bits, together, indicate one of three possible states: a logic level one state, a logic level zero state, and a don't care state. Each of the two MJT devices includes a pair of bi-directional resistive elements coupled in parallel (e.g. bi-directional resistive elements 32 and 34 and bi-directional resistive elements 38 and 40), and the two MJT devices share a pair of bi-directional resistive elements coupled in series (e.g., bi-directional resistive element 42 and 44). Each bitcell can be characterized as having two bitcell portions (e.g., portion 52 and 54) in which each portion is configured to store one of the two bits of the bitcell. Note that each bitcell portion may be referred to as a data storage portion. Also, note that the bi-directional resistive elements coupled in series provides a resistor divider portion coupled in series with each of the two bitcell portions. In alternate embodiments, note that each bitcell portion may include more than two bi-directional resistive elements coupled in parallel and each bitcell may include more than two bi-directional resistive elements coupled in series with each of the two bitcell portions.

External reference bitcell 24 is coupled to receive supply voltages V(Y+1), Vb, and Vb2, is coupled to WLR and MLR, and includes one MJT device which includes a pair of bi-directional resistive elements coupled in parallel (e.g. bi-directional resistive elements 62 and 64) and a pair of bi-directional resistive elements coupled in series (e.g. bi-directional resistive elements 70 and 72).

A bi-directional resistive element is used as a nonvolatile storage element which may be changed between two states: a high resistive state (HRS) and a low resistive state (LRS). The resistive element is coupled between two circuit nodes in which the resistive element can be programmed to a HRS or LRS based on the voltages applied to the two circuit nodes which result in a current flowing through the resistive element. Based on the orientation of the resistive element, a sufficient current flowing in a first direction through the resistive element programs the resistive element to a HRS (or allows the resistive element to remain in the HRS), while a sufficient current flowing in a second and opposite direction through the resistive element programs the resistive element to a LRS (or allows the resistive element to remain in the LRS). Examples will be provided with respect to FIGS. 2-10 below.

As used herein, it is assumed that if the two bi-directional resistive elements of a left bitcell portion (e.g. portion 52) are in a LRS (indicating a first bit value) and the two bi-directional resistive elements of a right bitcell portion (e.g. portion 54) are in an HRS (indicating a second bit value, different from the first bit value), the bitcell (e.g., bitcell 18) stores a logic level "0" state. If the two bi-directional resistive elements of the left bitcell portion are in an HRS (indicating the second bit value) and the two bi-directional resistive elements of the right bitcell portion are in a LRS (indicating the first bit value), the bitcell stores a logic level "1" state. If the two bi-directional resistive elements of the left bitcell portion are in an HRS (indicating the second bit value) and the two bi-directional resistive elements of the right bitcell portion are in a HRS (indicating the second bit value), the bitcell stores a "don't care" state. Also, as used herein, the series coupled bi-directional resistive elements (e.g. 42 and 44) of each bitcell are programmed to remain in a HRS. In alternate embodiments, different conventions may be used in which a different combination of resistive values (i.e. bit values) of the left bitcell portion and right bitcell portion indicate a state of the ternary bitcell. Furthermore, the series bi-directional resistive elements may be programmed to remain in an LRS based on the design of the MTJ devices.

Still referring to FIG. 1, bitcell 18 includes NMOS transistors 48, 50, 30, and 36, and resistors 32, 34, 38, 40, 42, and 44. Transistors 30 and 36 may be referred to as access transistors, transistor 48 may be referred to as a write transistor, and transistor 50 may be referred to as a read transistor. A first current electrode of transistor 30 is coupled to receive a supply voltage, V1, and a control electrode of transistor 30 is coupled to receive a corresponding true search line SL1. A first current electrode of transistor 36 is coupled to receive V1, and a control electrode is coupled to receive a corresponding complementary search line SL1b. A first terminal of resistor 32 and a first terminal of resistor 34 are coupled to a second current electrode of transistor 30, and a second terminal of resistor 32 and a second terminal of resistor 34 are coupled to a circuit node 46. A first terminal of resistor 38 and a first terminal of resistor 40 are coupled to a second current electrode of transistor 36, and a second terminal of resistor 38 and a second terminal of resistor 40 are coupled to node 46. A first terminal of resistor 42 is coupled to node 46, and a second terminal of resistor 42 is coupled to a first terminal of resistor 44. A second terminal of resistor 44 is coupled to supply voltage Vb. A first current electrode of transistor 48 is coupled to supply voltage Vb1, a control electrode of transistor 48 is coupled to a corresponding word line WL1, and a second control electrode of transistor 48 is coupled to node 46. A control electrode of transistor 50 is coupled to node 46, a first current electrode of transistor 50 is coupled to a corresponding match line ML1, and a second current electrode of transistor 50 is coupled to supply voltage Vb2. Note that each bitcell in rows 1-X of array 12 includes similar elements with similar connectivity.

Internal reference bitcell 20 includes NMOS transistors 98, 100, 102, and 104, and resistors 106, 108, 110, 112, 94, and 96. Transistors 102 and 104 may be referred to as access transistors, transistor 98 may be referred to as a write transistor, and transistor 100 may be referred to as a read transistor. A first current electrode of transistor 102 is coupled to receive V1 and a control electrode of transistor 102 is coupled to receive a corresponding true search line, SL1. A first current electrode of transistor 104 is coupled to receive V1, and a control electrode is coupled to receive a corresponding complementary search line, SL1b. A first terminal of resistor 106 and a first terminal of resistor 108 are coupled to a second current electrode of transistor 102, and a second terminal of resistor 106 and a second terminal of resistor 108 are coupled to a circuit node 95. A first terminal of resistor 110 and a first terminal of resistor 112 are coupled to a second current electrode of transistor104, and a second terminal of resistor 110 and a second terminal of resistor 112 are coupled to node 95. A first terminal of resistor 94 is coupled to node 95, and a second terminal of resistor 94 is coupled to a first terminal of resistor 96. A second terminal of resistor 96 is coupled to supply voltage Vb. A first current electrode of transistor 98 is coupled to supply voltage Vb1, a control electrode of transistor 98 is coupled to a corresponding word line WLR, and a second control electrode of transistor 98 is coupled to node 95. A control electrode of transistor 100 is coupled to node 95, a first current electrode of transistor 100 is coupled to a corresponding match line MLR, and a second current electrode of transistor 100 is coupled to supply voltage Vb2. Note that each internal reference bitcell in row X+1 of array 12 includes similar elements with similar connectivity.

External reference bitcell 24 includes NMOS transistors 74, 76, and 60, and resistors 62, 64, 70, and 72. Transistor 60 may be referred to as an access transistor, transistor 74 may be referred to as a write transistor, and transistor 76 may be referred to as a read transistor. A first current electrode of transistor 60 is coupled to receive a supply voltage, V(Y+1), and a control electrode of transistor 60 is coupled to receive a supply voltage, VR. A first terminal of resistor 62 and a second terminal of resistor 64 are coupled to a second current electrode of transistor 60, and a second terminal of resistor 62 and a first terminal of resistor 64 are coupled to a circuit node 79. A first terminal of resistor 74 is coupled to node 79, and a second terminal of resistor 70 is coupled to a first terminal of resistor 72. A second terminal of resistor 72 is coupled to supply voltage Vb. A first current electrode of transistor 74 is coupled to supply voltage Vb1, a control electrode of transistor 74 is coupled to a corresponding word line WLR, and a second control electrode of transistor 74 is coupled to node 79. A control electrode of transistor76 is coupled to node 79, a first current electrode of transistor 76 is coupled to a corresponding match line MLR, and a second current electrode of transistor 76 is coupled to supply voltage Vb2.

TCAM 10 also includes sense amplification circuitry 14 coupled to provide a match indicator corresponding to each row 1-X of array 12. For example, sense amplification circuitry 14 includes sense amplifier 82 coupled to match line ML1 output by the last bitcell, bitcell 21, in row 1 and provides a row 1 match indicator and sense amplifier 86 coupled to match line MLX output by the last bitcell, bitcell 22, in row X and provides a row X match indicator. TCAM 10 also includes current mirror circuitry 90 coupled to match line MLR output by external reference bitcell 24. Current mirror circuitry 90, along with a corresponding NMOS device, such as device 84 or 88, mirror the current on MLR as a corresponding reference current MLR1-MLRX provided to the corresponding sense amplifier 82 or 86. Therefore, each row in array 12, other than reference row 16, has a corresponding sense amplifier which receives a corresponding match line (ML1-ML1X) from the row and a corresponding mirrored reference current (MLR1-MLRX) and which provides a corresponding row match indicator (row 1 match indicator-row X match indicator).

In operation, TCAM 10 stores a plurality of Y-bit data values in rows 1-X of array 12. For a search operation, TCAM 10 receives a Y-bit search value and searches each of rows 1-X to determine if a match exists between the Y-bit search value and a stored Y-bit data value in any of rows 1-X. The Y-bit search value is provided to search lines SL1/SL1b-SLY/SLYb. If all Y bits result in a match, then a row match is indicated and the corresponding match line for the row is not discharged. If one or more of the Y bits do not match, then a mismatch is indicated, and the corresponding match line of the row is discharged. If the two bits stored in a bitcell indicate a logic level 0 or a logic level 1, then when the corresponding bit of the search value is also a logic level 0 or logic level 1, respectively, a match is indicated for that bitcell. However, if the two bits in a bitcell indicate a don't care state, then a match is indicated for that bitcell, regardless of the value of the corresponding bit of the search value. As will be described in more detail below, each bitcell includes two MTJ devices to store the two bits, and since each MTJ device includes a pair of resistors in parallel, the voltage across the MTJ device is limited, thus preventing read disturb by avoiding stresses on any resistor within the bitcell.

Since each bitcell in a row is coupled to a same match line, if any one bitcell results in a match, the match line is discharged. This discharge by one or more mismatched bitcells is detected by the corresponding sense amplifier by comparison with the corresponding mirrored reference current. As will be described in more detail below, due to the small resistance variation in an MTJ device which indicates whether a bit is a logic level one or a logic level zero, a single bitcell mismatch may not sufficiently discharge the match line to be detected by the corresponding sense amplifier. Therefore, reference row 16 is used to generate an appropriate mirrored reference current for each sense amplifier. In reference row 16, internal reference bitcells 20-23 address the leakage current on a match line when a match occurs and external reference bitcell 24 addresses the current on the match line when a mismatch occurs. In this manner, the match line of reference row 16 is used to provide a mirrored reference current for each sense amplifier which allows for improved detection of a row mismatch due to a single bit mismatch.

FIGS. 2-8 illustrate, in schematic form, a more detailed view of bitcell 18 of array 12 during various example operations. FIGS. 2-5 illustrate bitcell 18 during various TCAM search operations. During each TCAM search operation, which includes a read operation of bitcell 18, read disturb can result in inadvertently changing the stored data value in bitcell 18 by inadvertently changing the resistive state of resistive element 32, 34, 38, or 40. For example, due to the orientation of the resistive elements in bitcell 18, when resistive elements 32, 34, 38, and 40 are in a HRS, they can be programmed to a LRS by raising node A to a voltage sufficiently higher than a voltage at the first terminals of the resistive elements, which results in a sufficient current going up through the resistive elements to change resistive states. If these resistive elements are in a HRS and current flows down through the resistive element from its first terminal to node A, the resistive element remains in a HRS. When resistive elements 32, 34, 38, and 40 are in a LRS, they can be programmed to a HRS by raising the first terminals of the resistive elements to a voltage sufficiently higher than the voltage at node A, which results in a sufficient current going down through the resistive elements to change resistive states. A resistive element is stressed when the voltage applied to the first and second terminals of the resistive element results in a current flowing in the direction which, when sufficiently large, results in changing the resistive state of the resistive element. For example, in the case of a resistive element in the LRS state, the resistive element is stressed when current runs down through the resistive element which may reach a large enough magnitude to inadvertently change the resistive state of the resistive element from LRS to HRS. Therefore, as will be seen in the example which follow, the use of parallel resistive elements for the MTJ, such as resistive 32 and 34 or resistive elements 38 and 40, addresses read disturb by preventing stress on susceptible resistive elements.

During a TCAM search operation on bitcell 18, a first bit of a Y-bit search data value is provided as SL1 to the control electrode of transistor 30 and the complement of the first bit of the Y-bit search data value is provided as SL1b to the control electrode of transistor 36 to determine if the first bit of the Y-bit search value matches the first bit of the Y-bit data value which is stored in bitcell 18. Internal node A corresponds to circuit node 46. In the illustrated examples of FIGS. 2-5, resistive elements 32 and 34 of bitcell portion 52 are in a LRS and resistive elements 38 and 40 of bitcell portion 54 are in a HRS. Therefore, bitcell 18 stores a logic level "0". For the search operation, V1 is set to the appropriate read voltage, such as, for example, 0.8 V, and Vb and Vb1 are each set to an appropriate voltage, such as 0V. At the start of the search operation, a positive pulse is applied to the control electrode of transistor 48 thus resetting node A to Vb1, which is 0V in the current example.

Figure 2:
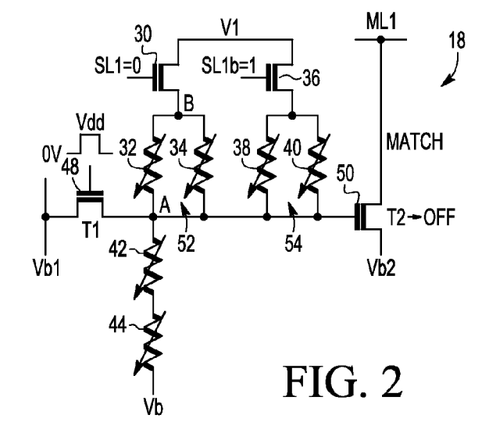
FIGS. 2-8 illustrate, in schematic form, a bitcell of the TCAM of FIG. 1 when performing various example operations.

FIG. 2 illustrates bitcell 18 during a TCAM search operation which results in a match. Therefore, the search bit value provided as SL1 is also a logic level "0", and thus, SL1b is a logic level 1. This results in transistor 30 being off and transistor 36 being on. Therefore, the first terminals of resistive elements 32 and 34 are floating while the voltage of V1 is applied to the first terminals of resistive elements 38 and 40. During the search operation, as SL1 and SL1b are being applied to the control electrodes of transistors 30 and 36, respectively, the voltage on node A increases to 0.8*(V1−Vb)+Vb. This is not sufficient to turn on transistor 50 which therefore remains off. That is, the parallel resistance of resistive elements 38 and 40 is high relative to the high resistance of resistive elements 42 and 44 and maintains transistors 50 off. In this case, ML1 is not discharged by transistor 50.

Note that during the search operation, current flows down through resistive elements 38 and 40 from transistor 36 to node A. Since both resistive elements are in a HRS, the voltages during the search operation do not stress the resistive elements. Note that similar descriptions apply in the case of a match in which bitcell 18 stores a logic level "1". In this case, resistive elements 32 and 34 are in a HRS and resistive elements 38 and 40 are in a LRS. For the case of a match, SL1 would be a logic level one, thus turning on transistor 30. Transistor 36 is turned off by SL1b. Therefore, as with the example of FIG. 2, the voltage on node A increases to 0.8*(V1−Vb)+Vb which is not sufficient to turn on transistor 50. Therefore, regardless of which match case occurs (with a logic level "0" or logic level "1" stored in bitcell 18), node A corresponds to a voltage divider node between a parallel coupled pair of resistive elements (38/40 or 32/40), each in a HRS, and a pair of series coupled resistive elements, each in a HRS. In this manner, regardless of the match case, none of the resistive elements are stressed.

Figure 3:
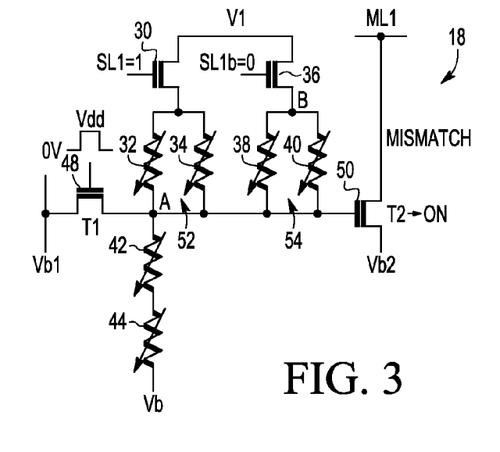

FIG. 3 illustrates bitcell 18 during a TCAM search operation which results in a mismatch. Therefore, the search bit value provided as SL1 is a logic level "1" and SLb is a logic level 0. This results transistor 30 being on and transistor 36 being off. Therefore, the first terminals of resistive elements 38 and 40 are floating while the voltage of V1 is applied to the first terminals of resistive elements 32 and 34. During the search operation, as SL1 and SL1b are being applied to the control electrodes of transistors 30 and 36, respectively, assuming a HRS to LRS resistance ratio of 2, the voltage on node A increases to 0.9*(V1−Vb)+Vb. This is sufficient to turn on transistor 50 which results in discharging ML1. The parallel resistance of resistive elements 32 and 34 relative to the series resistance of resistive elements 42 and 44 is not as high as the match example of FIG. 2. This results in only a small read stress on resistive elements 32 and 34. However, the voltage between the first terminals of resistive elements 32 and 34 and node A is not sufficient to change the resistive state of the resistive elements. In this example, the read stress (i.e. the voltage across resistive elements 32 and 34) is maintained at or below 100 mV. Also, since the resistance of the HRS is only about twice the resistance of the LRS, a current delta of about 10× is created between the match and mismatch case while maintaining a low read disturb. Therefore, it can be seen how the use of two resistive elements in a LRS coupled in parallel rather than a single resistive element in a LRS in bitcell 18 prevents read disturb.

Figure 4:
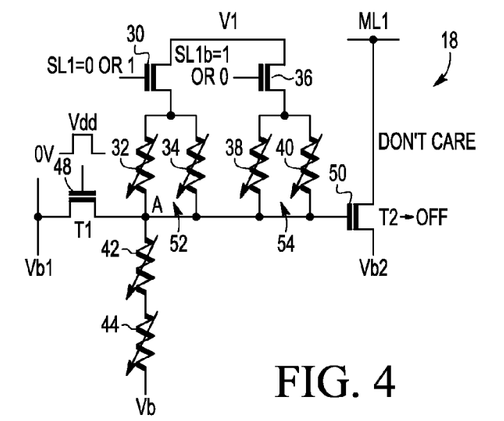

FIG. 4 illustrates bitcell 18 during a TCAM search operation in which bitcell 18 stores a "don't care". Therefore, resistive elements 32, 34, 38, and 40 are each in a HRS, which corresponds to storing a "don't care" state. Regardless of the bit value of the search bit value (whether SL/SLb=0/1 or 1/0), only one of transistor 30 and 36 is on. Similar to the match case of FIG. 2, one parallel coupled pair of resistive elements 32/34 or 38/40 is coupled in the voltage divider with resistive elements 42 and 44. Similar to the match case, the voltage at node A increases from Vb to 0.8(V1−Vb)+Vb, which is not sufficient to turn on resistor 50. That is, regardless of whether SL=0 or 1, transistor 50 remains off and ML1 is not discharged. Furthermore, the voltages during the search operation do not stress the resistive elements since they are in a HRS and current flows down through the parallel coupled pair of resistive elements to node A.

Figure 5:
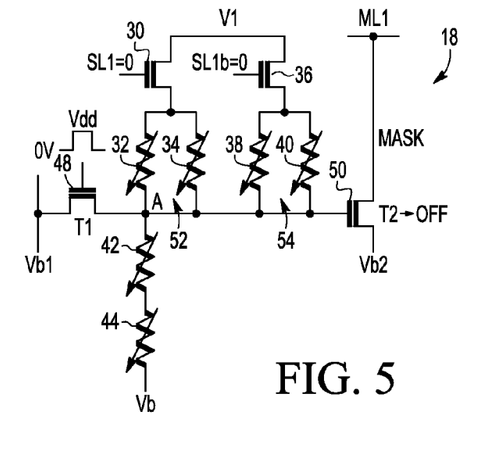

FIG. 5 illustrates bitcell 18 during a TCAM search operation in which the search value is masked such that a match is indicated regardless of the value stored in bitcell 18. In this case, bitcell 18 stores a logic level "0" as in FIG. 3, however, due to the mask, the values of SL1 and SL1b are both forced to a logic level "0". This results in turning off both transistors 30 and 36. In this manner, during a masked search operation, no resistive transistor is stressed.

Figure 6:
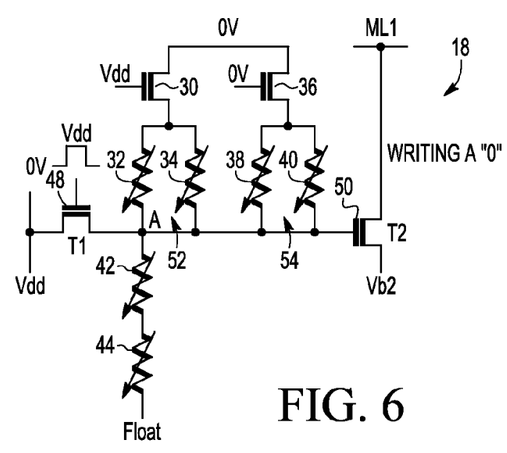
Figure 7:
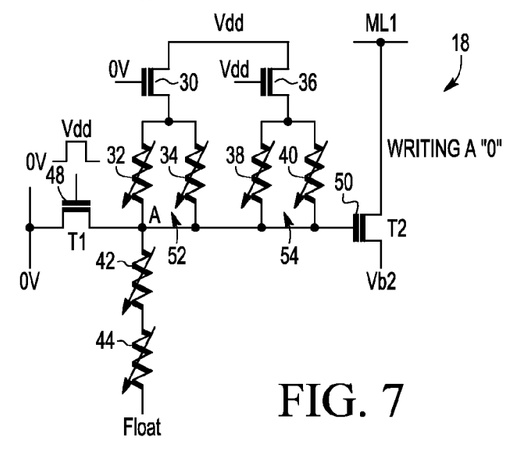
Figure 8:
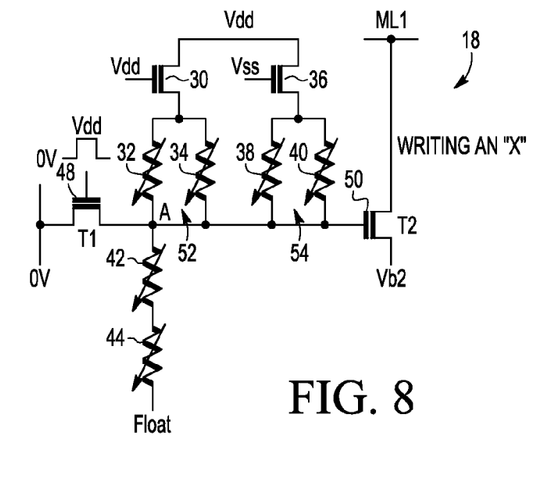

FIGS. 6-8 illustrate bitcell 18 during a TCAM write operation. FIGS. 6 and 7 illustrate the storing or writing of a logic level "0" into bitcell 18. As described above, a logic level "0" corresponds to resistive elements 32 and 34 being in a LRS and resistive elements 38 and 40 being in a HRS. Therefore, as illustrated in FIG. 6, a programming operation is performed on resistive element pair 32/34 to place the resistive elements into a LRS. This may be accomplished by setting V1 to 0V, applying a voltage, Vdd, to the control electrode of transistor 30 to turn on the access transistor, and by supplying a pulse to transistor 48 which couples Vdd to node A. Therefore, node A goes high and current flows from node A up through resistive elements 32 and 34, programming them to a LRS. Note that the second terminal of resistive element 44 is allowed to float. After programming resistive element pair 32/34, resistive element pair 38/40 is programmed to a HRS. As illustrated in FIG. 7, this may be accomplished by setting V1 to Vdd, applying Vdd to the control electrode of transistor 36 to turn on the access transistor, and by supplying a pulse to transistor 48 which couples 0V to node A. In this case, node A goes low and current flows from transistor 36 down through resistive elements 38 and 40, programming them to a HRS. Again, the second terminal of resistive element 44 is allowed to float.

Note that a logic level "1" may be stored into bitcell 18 in a similar manner in which first resistive elements 38 and 40 are programmed to a LRS, and, subsequently, resistive elements 32 and 34 are programmed to a HRS. This can be done by controlling access transistors 36 and 30 accordingly.

FIG. 8 illustrates the storing or writing of a "don't care" state into bitcell 18. As described above, a "don't care" state corresponds to resistive elements 32 and 34 being in a HRS and resistive elements 38 and 40 being in a HRS. Therefore, as illustrated in FIG. 8, a programming operation is performed on both resistive element pairs 32/34 and 38/40 to place the resistive elements into a HRS. This may be accomplished by setting V1 to Vdd, applying Vdd to the control electrodes of transistors 30 and 36 to turn on both access transistors, and by supplying a pulse to transistor 48 which couples 0V to node A. Therefore, node A goes low and current flows from transistors 30 and 36 down through resistive elements 32 and 34 and resistive elements 38 and 40, thus programming them all to a HRS. Note that the second terminal of resistive element 44 is allowed to float. In alternate embodiments, each resistive element pair may be programmed in separate steps.

All of the bitcells in rows 1-X of array 12 may be programmed with the desired state (a logic level "1" state, a logic level "0" state, or a "don't care" state) as described above. Furthermore, prior to performing search operations, reference row 16 is conditioned appropriately. Each internal reference bitcell (those bitcells at each intersection of row X+1 and columns 1 through Y) are conditioned so as to match the match case, in which the corresponding match line is not discharged. As described above with respect to FIGS. 2-4, in the case of a match, regardless of whether a bitcell stores a logic level "0", a logic level "1", or a "don't care", a pair of parallel coupled resistive elements in a HRS (e.g., such as one of pair 32/34 or pair 38/34) forms a voltage divider with a pair of series coupled resistive elements (e.g. resistive elements 42 and 44) in which the voltage divider node (e.g. node A) is coupled to the control electrode of the read transistor (e.g. transistor 50) which prevents the transistor from turning on during the match case, thus preventing discharge of the corresponding match line. Therefore, each internal reference bitcell in row X+1 is conditioned by programming each pair of parallel coupled resistive elements to a HRS. This may be done using operations similar to those described above with respect to FIG. 8, similar to writing a "don't care" state into each internal reference bitcell. In this manner, since each internal reference bitcell matches the match case, the match line of the reference row, MLR, nulls the leakage current of a match line of array 12 which is not discharged as a result of a match between the search data value and stored data value.

Figure 9:
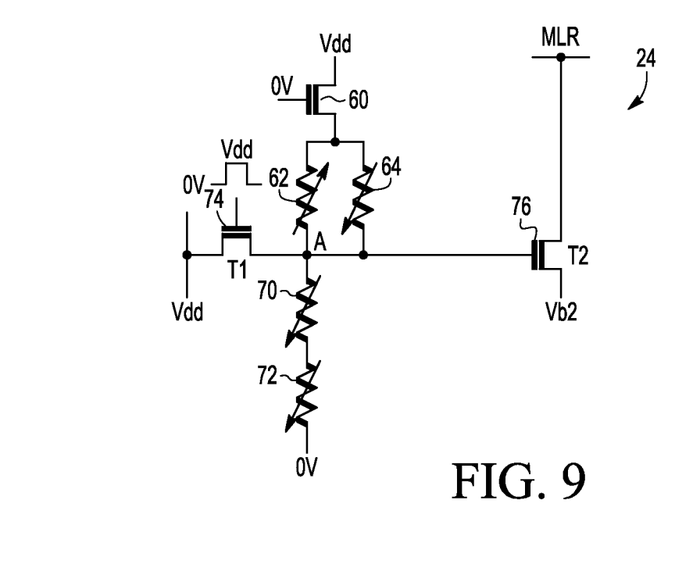
FIGS. 9 and 10 illustrate, in schematic form, an external reference bitcell of the TCAM of FIG. 1 when performing various example operations.
Figure 10:
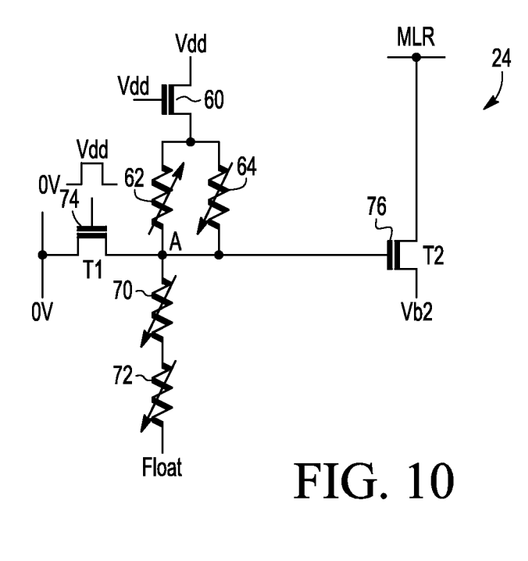

FIGS. 9-10 illustrate conditioning external reference bitcell 24. External reference bitcell 24 averages the current between the cases in which all bits match and a single bit mismatches. In the case of a single bit mismatch, only one read transistor of the row results in discharging the match line. Due to the relatively small difference in resistance between the HRS and LRS, a single bit mismatch may not sufficiently discharge the match line for the purpose of detection by a sense amplifier. Therefore, for the external reference bit, resistive elements 70 and 72 are first programmed to a HRS, as illustrated in FIG. 9, and resistive elements 64 and 62 are then programmed to a HRS and LRS, respectively, as illustrated in FIG. 10. As illustrated in FIG. 9, resistive elements 70 and 72 may be programmed by setting the supply voltage V(Y+1) of bitcell 24 to Vdd or 0V, applying a voltage, 0V, to the control electrode of transistor 60 to turn off the access transistor, and by applying a pulse to the control electrode of transistor 74 which couples Vdd to node A. Therefore, node A goes high and resistive elements 70 and 72 are programmed to a HRS. Note that resistive elements 62 and 64 are not affected by this operation. After programming resistive elements 70 and 72 to a HRS, resistive element 62 is programmed to a LRS and resistive element 64 is programmed to a HRS, as illustrated in FIG. 10. Resistive element 62 is coupled in an opposite orientation to resistive element 64, as indicated by the arrow through the variable resistor. The supply voltage V(Y+1) is set to Vdd, and a pulse is applied to control electrode of transistor 74 which couples 0V to node A. Therefore, node A goes low and resistive element 62 is programmed to a LRS and resistive element 64 is programmed to a HRS. Resistive element 62, due to its opposite orientation than the orientations described above within bitcell 18, is programmed to a LRS when sufficient current runs down through the resistive element.

The reference bitcells provide for a more accurate reference current for each of the sense amplifiers based on MLR, which is coupled to the reference bitcells. Reference row 16 allows MLR to closely match the match line discharge by taking into consideration the weak mismatch case (e.g. in which only one bit mismatches) vs. the all match case. The internal reference bitcells take into consideration the leakage current of an all match case and the external reference bitcell achieves a reference signal which is in the middle of the worst case. In this manner, referring to FIG. 1, each sense amplifier can more accurately generate the appropriate row match indicator by comparing the match line of the corresponding row (ML1-MLX) to the corresponding reference match line (MLR1-MLRX) in which all of the corresponding reference match lines are generated through a current mirror from the current on MLR. That is, MLR1 is a mirrored current of the current on MLR achieved by the current mirror formed by circuitry 90 and transistor 84. Similarly, MLRX is a mirrored current of the current on MLR achieved by the current mirror formed by circuitry 90 and transistor 88. The sense amplifier, in response to comparing the row match line (ML1-MLX) to the corresponding reference match line (MLR1-MLRX), can generate the corresponding row match indicator (Row 1 match indicator-Row X match indicator), accordingly. For example, if the corresponding match line (ML1-MLX) is less than the corresponding reference match line (MLR1-MLRX), then the corresponding row match indicator is negated, to indicate a mismatch in that row. If the corresponding match line is not less than the corresponding reference match line, the corresponding row match indicator is asserted to indicate a match in that row.

Therefore, by now it can be appreciated how the use of parallel coupled resistive elements to implement an MTJ device within a ternary CAM bitcell can prevent read disturb. Furthermore, through the use of both internal and external reference bitcells, improved reference match lines are provided which allow for better detection between the case in which all bits of a row match or a weak mismatch, in which just one bit in the row mismatches. In this manner, an improved ternary CAM may be achieved.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The description of the memory system architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of system 10 are circuitry located on a single integrated circuit or within a same device. Alternatively, system 10 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the bitcells may be designed using MTJ's whose bi-directional resistive elements are coupled in different orientations. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a memory device includes an array of ternary content addressable memory (TCAM) cells, each of the TCAM cells including: a first cell portion including a first programmable resistive element coupled in parallel with a second resistive element; a second cell portion coupled in parallel with the first cell portion, the second cell portion including a third programmable resistive element coupled in parallel with a fourth resistive element; a plurality of match lines, each of the plurality of match lines is coupled to a respective row of the TCAM cells at an output of each of the first and second cell portions in the respective row; a plurality of true search lines, each of the plurality of true search lines is coupled to control input to the first cell portion of a respective column of the TCAM cells; and a plurality of complementary search lines, each of the plurality of complementary search lines is coupled to control input to the second cell portion of the respective column of the TCAM cells. In one aspect of the above embodiment, each of the TCAM cells further includes at least two programmable resistors coupled in series, a first one of the at least two programmable resistors has a first terminal coupled at the output of the first and second cell portions, and a second one of the at least two programmable resistors has a first terminal coupled to a first supply voltage. In another aspect, each of the TCAM cells further includes a write transistor including a first current electrode coupled to a first supply voltage, a second current electrode coupled to the output of the first and second cell portions, and a control electrode coupled to one of a plurality of word lines. In a further aspect, each of the TCAM cells further includes a read transistor including a first current electrode coupled to one of the plurality of match lines, a second current electrode coupled to a second supply voltage, and a control electrode coupled to the output of the first and second cell portions. In another aspect, each of the TCAM cells further includes a first search transistor including a first current electrode coupled to a third supply voltage, a second current electrode coupled to the input of the first cell portion, and a control electrode coupled to one of the true search lines; and a second search transistor including a first current electrode coupled to the third supply voltage, a second current electrode coupled to the input of the second cell portion, and a control electrode coupled to one of the complementary search lines. In another aspect, the memory device further includes a plurality of sense amplifiers, each of the sense amplifiers including a first input coupled to one of the plurality of match lines and an output providing a corresponding row match indicator. In a further aspect, the memory device further includes an external reference TCAM cell that is external to the array of TCAM cells; a row of internal reference TCAM cells, wherein each of the internal reference TCAM cells is coupled to a respective one of the plurality of true search lines and a respective one of the plurality of complementary search lines; a reference match line coupled to the internal reference TCAM cells and to the external reference TCAM cell; and a current mirror coupled between the reference match line at the external reference TCAM cell and an input to each of the plurality of sense amplifiers. In yet a further aspect, the external reference TCAM cell includes: a first cell portion including a fifth programmable resistive element coupled in parallel with a sixth resistive element; at least two programmable resistors coupled in series, a first one of the at least two programmable resistors has a first terminal coupled at the output of the first cell portion of the external reference TCAM cell, and a second one of the at least two programmable resistors has a first terminal coupled to the first supply voltage; a write transistor including a first current electrode coupled to the first supply voltage, a second current electrode coupled to the output of the first cell portion, and a control electrode coupled to a reference word line; a read transistor including a first current electrode coupled to the reference match line, a second current electrode coupled to the second supply voltage, and a control electrode coupled to the output of the first cell portion; and a search transistor including a first current electrode coupled to a fourth supply voltage, a second current electrode coupled to the input of the first cell portion, and a control electrode coupled to a reference voltage. In another aspect, each of the internal TCAM reference cells further include a first cell portion including a fifth programmable resistive element coupled in parallel with a sixth resistive element; a second cell portion coupled in parallel with the first cell portion, the second cell portion including a seventh programmable resistive element coupled in parallel with an eighth resistive element; at least two programmable resistors coupled in series, a first one of the at least two programmable resistors has a first terminal coupled at the output of the first and second cell portions of a respective one of the internal TCAM reference cells, and a second one of the at least two programmable resistors has a first terminal coupled to the first supply voltage; a write transistor including a first current electrode coupled to the first supply voltage, a second current electrode coupled to the output of the first cell portion, and a control electrode coupled to a reference word line; a read transistor including a first current electrode coupled to the reference match line, a second current electrode coupled to the second supply voltage, and a control electrode coupled to the output of the first and second cell portions; a first search transistor including a first current electrode coupled to the third supply voltage, a second current electrode coupled to the input of the first cell portion, and a control electrode coupled to one of the true search lines; and a second search transistor including a first current electrode coupled to the third supply voltage, a second current electrode coupled to the input of the second cell portion, and a control electrode coupled to one of the complementary search lines.

In another embodiment, a semiconductor device includes a first ternary content addressable memory (TCAM) cell coupled to a first word line and a first match line and including a first data storage portion coupled to a first search line, a second data storage portion coupled to a complement of the first search line, and a resistor divider portion including two resistive elements coupled in series with the first and second data storage portions of the first TCAM cell; wherein the first and second data storage portions of the first TCAM cell are coupled to a first supply voltage and include two resistive elements coupled in parallel. In one aspect of the above another embodiment, the first TCAM cell further includes a write transistor including a first current electrode coupled to the first supply voltage, a second current electrode coupled to an output of the first and second data storage portions, and a control electrode coupled to the first word line. In a further aspect, the first TCAM cell further includes a read transistor including a first current electrode coupled to the first match line, a second current electrode coupled to a second supply voltage, and a control electrode coupled to the output of the first and second data storage portions. In yet a further aspect, the device further includes a first search transistor including a first current electrode coupled to a the first supply voltage, a second current electrode coupled to an input of the first data storage portion, and a control electrode coupled to the first search line; and a second search transistor including a first current electrode coupled to the first supply voltage, a second current electrode coupled to an input of the second data storage portion, and a control electrode coupled to a complement of the first search line. In another aspect of the another embodiment, the device further includes an internal reference TCAM cell coupled to a reference word line and a reference match line (MLR) and including a first data storage portion coupled to the first search line and a second data storage portion coupled to the complement of the first search line, and a resistor divider portion including two resistive elements coupled in series with the first and second data storage portions of the internal reference TCAM cell, wherein the first and second data storage portions of the first TCAM cell and the internal reference TCAM cell are coupled to the first supply voltage and include two resistive elements coupled in parallel. In a further aspect, the device further includes an external reference TCAM cell including a data storage portion coupled to a third supply voltage, the reference word line, and the reference match line, and a resistor divider portion including two resistive elements coupled in series with the data storage portion of the external reference TCAM cell, wherein the data storage portion of the external reference TCAM cell includes two resistive elements coupled in parallel. In yet a further aspect, the device further includes a sense amplifier including a first input coupled to the first match line and an output providing a corresponding row match indicator. In yet an even further aspect, the device further includes a current mirror coupled between the reference match line at the external reference TCAM cell and a second input to the sense amplifier.

In yet another embodiment, a method of operating a ternary content addressable memory (TCAM) cell includes placing two resistive elements coupled in series in a resistance divider portion of the TCAM cell in a high resistance state; placing two resistive elements in a first data storage portion of the TCAM cell in a low resistance state; placing two resistive elements in a second data storage portion of the TCAM cell in a high resistance state, wherein the two resistive elements in each of the first and second data storage portions are coupled in parallel and an output of each of the first and second data storage portions is coupled to the resistance divider portion; detecting a match in the TCAM cell by: applying a read voltage at a first switch that is coupled to an input of the first data storage portion and coupled to a search line, and at a second switch that is coupled to an input of the second data storage portion and coupled to a complement of the search line; applying a search line voltage to the search line that places the first switch in a non-conducting mode; applying a complementary search line voltage to the complementary search line that places the second switch in a conducting mode; and sensing voltage on a match line coupled to the TCAM cell as remaining in a first state during the search line and complementary search line voltages are applied. In one aspect of the above yet another embodiment, the method further includes detecting a mismatch in the TCAM cell by: applying a read voltage at the first switch and the second switch; applying a search line voltage to the search line that places the first switch in a conducting mode, applying a complementary search line voltage to the complementary search line that places the second switch in a non-conducting mode. In another aspect, detecting the match in the TCAM cell further includes generating a reference match line signal on a reference match line coupled to an output of a reference TCAM cell, wherein the reference TCAM cell includes a first data storage portion having two resistive elements coupled in parallel, and a resistance divider coupled to an output of the first data storage portion, sensing the voltage on the match line and the voltage on the reference match line using a sense amplifier, wherein the match line and the reference match line are coupled as inputs to the sense amplifier.

What is claimed is:
1. A memory device comprising:
an array of ternary content addressable memory (TCAM) cells, each of the TCAM cells including:
  a first cell portion including a first programmable resistive element coupled in parallel with a second resistive element;
  a second cell portion coupled in parallel with the first cell portion, the second cell portion including a third programmable resistive element coupled in parallel with a fourth resistive element;

a plurality of match lines, each of the plurality of match lines is coupled to a respective row of the TCAM cells at an output of each of the first and second cell portions in the respective row;

a plurality of true search lines, each of the plurality of true search lines is coupled to control input to the first cell portion of a respective column of the TCAM cells; and a plurality of complementary search lines, each of the plurality of complementary search lines is coupled to control input to the second cell portion of the respective column of the TCAM cells, wherein each of the TCAM cells further comprises at least two programmable resistors coupled in series, a first one of the at least two programmable resistors has a first terminal coupled at the output of the first and second cell portions, and a second one of the at least two programmable resistors has a first terminal coupled to a first supply voltage.

2. The memory device of claim 1, wherein each of the TCAM cells further comprises:

a write transistor including a first current electrode coupled to a second supply voltage, a second current electrode coupled to the output of the first and second cell portions, and a control electrode coupled to one of a plurality of word lines.

3. The memory device of claim 2, wherein each of the TCAM cells further comprises:

a read transistor including a first current electrode coupled to one of the plurality of match lines, a second current electrode coupled to a third supply voltage, and a control electrode coupled to the output of the first and second cell portions.

4. The memory device of claim 3, wherein each of the TCAM cells further comprises:

a first search transistor including a first current electrode coupled to a fourth supply voltage, a second current electrode coupled to the input of the first cell portion, and a control electrode coupled to one of the true search lines; and a second search transistor including a first current electrode coupled to the fourth supply voltage, a second current electrode coupled to the input of the second cell portion, and a control electrode coupled to one of the complementary search lines.

5. The memory device of claim 1 further comprising:

a plurality of sense amplifiers, each of the sense amplifiers including a first input coupled to one of the plurality of match lines and an output providing a corresponding row match indicator.

6. A memory device comprising:

an array of ternary content addressable memory (TCAM) cells, each of the TCAM cells including:

a first cell portion including a first programmable resistive element coupled in parallel with a second resistive element;

a second cell portion coupled in parallel with the first cell portion, the second cell portion including a third programmable resistive element coupled in parallel with a fourth resistive element;

a plurality of match lines, each of the plurality of match lines is coupled to a respective row of the TCAM cells at an output of each of the first and second cell portions in the respective row;

a plurality of true search lines, each of the plurality of true search lines is coupled to control input to the first cell portion of a respective column of the TCAM cells; and a plurality of complementary search lines, each of the plurality of complementary search lines is coupled to control input to the second cell portion of the respective column of the TCAM cells;

a plurality of sense amplifiers, each of the sense amplifiers including a first input coupled to one of the plurality of match lines and an output providing a corresponding row match indicator;

an external reference TCAM cell that is external to the array of TCAM cells;

a row of internal reference TCAM cells, wherein each of the internal reference TCAM cells is coupled to a respective one of the plurality of true search lines and a respective one of the plurality of complementary search lines;

a reference match line coupled to the internal reference TCAM cells and to the external reference TCAM cell; and a current mirror coupled between the reference match line at the external reference TCAM cell and an input to each of the plurality of sense amplifiers.

7. The memory device of claim 6 wherein the external reference TCAM cell includes:

a first cell portion including a fifth programmable resistive element coupled in parallel with a sixth resistive element;

at least two programmable resistors coupled in series, a first one of the at least two programmable resistors has a first terminal coupled at the output of the first cell portion of the external reference TCAM cell, and a second one of the at least two programmable resistors has a first terminal coupled to the first supply voltage;

a write transistor including a first current electrode coupled to the first supply voltage, a second current electrode coupled to the output of the first cell portion, and a control electrode coupled to a reference word line;

a read transistor including a first current electrode coupled to the reference match line, a second current electrode coupled to the second supply voltage, and a control electrode coupled to the output of the first cell portion; and a search transistor including a first current electrode coupled to a fourth supply voltage, a second current electrode coupled to the input of the first cell portion, and a control electrode coupled to a reference voltage.

8. The memory device of claim 6, wherein each of the TCAM cells further comprises:

at least two programmable resistors coupled in series, a first one of the at least two programmable resistors has a first terminal coupled at the output of the first and second cell portions, and a second one of the at least two programmable resistors has a first terminal coupled to a first supply voltage.

9. The memory device of claim 6, wherein each of the TCAM cells further comprises:

a write transistor including a first current electrode coupled to a first supply voltage, a second current electrode coupled to the output of the first and second cell portions, and a control electrode coupled to one of a plurality of word lines.

10. The memory device of claim 9, wherein each of the TCAM cells further comprises:

a read transistor including a first current electrode coupled to one of the plurality of match lines, a second current electrode coupled to a second supply voltage, and a control electrode coupled to the output of the first and second cell portions.

11. The memory device of claim 10, wherein each of the TCAM cells further comprises:
   a first search transistor including a first current electrode coupled to a third supply voltage, a second current electrode coupled to the input of the first cell portion, and a control electrode coupled to one of the true search lines; and
   a second search transistor including a first current electrode coupled to the third supply voltage, a second current electrode coupled to the input of the second cell portion, and a control electrode coupled to one of the complementary search lines.

12. The memory device of claim 6 further comprising:
a plurality of sense amplifiers, each of the sense amplifiers including a first input coupled to one of the plurality of match lines and an output providing a corresponding row match indicator.

13. A memory device comprising:
an array of ternary content addressable memory (TCAM) cells, each of the TCAM cells including:
   a first cell portion including a first programmable resistive element coupled in parallel with a second resistive element;
   a second cell portion coupled in parallel with the first cell portion, the second cell portion including a third programmable resistive element coupled in parallel with a fourth resistive element;
a plurality of match lines, each of the plurality of match lines is coupled to a respective row of the TCAM cells at an output of each of the first and second cell portions in the respective row;
a plurality of true search lines, each of the plurality of true search lines is coupled to control input to the first cell portion of a respective column of the TCAM cells; and
a plurality of complementary search lines, each of the plurality of complementary search lines is coupled to control input to the second cell portion of the respective column of the TCAM cells,
wherein each of the internal TCAM reference cells further comprise:
   a first cell portion including a fifth programmable resistive element coupled in parallel with a sixth resistive element;
   a second cell portion coupled in parallel with the first cell portion, the second cell portion including a seventh programmable resistive element coupled in parallel with an eighth resistive element;
   at least two programmable resistors coupled in series, a first one of the at least two programmable resistors has a first terminal coupled at the output of the first and second cell portions of a respective one of the internal TCAM reference cells, and a second one of the at least two programmable resistors has a first terminal coupled to the first supply voltage;
   a write transistor including a first current electrode coupled to the first supply voltage, a second current electrode coupled to the output of the first cell portion, and a control electrode coupled to a reference word line;
   a read transistor including a first current electrode coupled to the reference match line, a second current electrode coupled to the second supply voltage, and a control electrode coupled to the output of the first and second cell portions;
   a first search transistor including a first current electrode coupled to the third supply voltage, a second current electrode coupled to the input of the first cell portion, and a control electrode coupled to one of the true search lines; and
   a second search transistor including a first current electrode coupled to the third supply voltage, a second current electrode coupled to the input of the second cell portion, and a control electrode coupled to one of the complementary search lines.

* * * * *